(12) United States Patent
Ashitomi (10) Patent No.: US 8,262,898 B2
(45) Date of Patent: Sep. 11, 2012

(54) NANOTUBE POSITION CONTROLLING METHOD, NANOTUBE POSITION CONTROLLING FLOW PATH PATTERN AND ELECTRONIC ELEMENT USING NANOTUBE

(76) Inventor: Masanori Ashitomi, Okinawa (JP)

( * ) Notice: Subject to any disclaimer, the term of this patent is extended or adjusted under 35 U.S.C. 154(b) by 1059 days.

(21) Appl. No.: 11/597,074

(22) PCT Filed: May 12, 2005

(86) PCT No.: PCT/JP2005/008680
§ 371 (c)(1),
(2), (4) Date: Nov. 20, 2006

(87) PCT Pub. No.: WO2005/115911
PCT Pub. Date: Dec. 8, 2005

(65) Prior Publication Data
US 2007/0243464 A1    Oct. 18, 2007

(30) Foreign Application Priority Data
May 31, 2004   (JP) .................................. 2004-162194

(51) Int. Cl.
*B01D 43/00* (2006.01)
(52) U.S. Cl. .............. 205/768; 204/298.01; 204/298.13; 427/282; 977/842
(58) Field of Classification Search .................. 429/209; 427/282; 204/547, 643, 298.01, 298.12, 204/298.13; 977/842; 333/186; 205/687, 205/766, 768
See application file for complete search history.

(56) References Cited

U.S. PATENT DOCUMENTS

2002/0167374 A1* 11/2002 Hunt et al. .................... 333/186
2002/0172639 A1  11/2002 Horiuchi et al.
2003/0186522 A1* 10/2003 Duan et al. .................... 438/584
2004/0023514 A1   2/2004 Moriya et al.
2004/0173378 A1*  9/2004 Zhou et al. .................... 174/260
2005/0072677 A1*  4/2005 Gascoyne et al. ............ 204/547

FOREIGN PATENT DOCUMENTS

| JP | 2002-346996 A | 12/2002 |
| JP | 2003-332266 A | 11/2003 |
| JP | 2004-71654 A  | 3/2004  |

OTHER PUBLICATIONS

Huang, Y., et al. "Directed Assembly of One-Dimensional Nanostructures into Functional Networks", Science, vol. 291, Jan. 26, 2001, p. 630-633.*
Conference proceedings of the 64th Annual Meeting of the Japan Society of Applied Physics, 2003 Autumn, at The Fukuoka University, 3/aE-1.
Korean Office Action dated Dec. 22, 2011 in counterpart Korean Application No. 10-2006-7024597.

* cited by examiner

*Primary Examiner* — J. Christopher Ball
(74) *Attorney, Agent, or Firm* — Holtz, Holtz, Goodman & Chick, PC (57) ABSTRACT

A flow-path pattern provided with plural flow paths along a facing direction of facing electrodes is placed on the facing electrodes, a carbon nanotube-dispersed solvent is guided to the flow paths to allow it to flow in one direction, and, after the solvent is dried, the flow-path pattern is peeled off the facing electrodes, thereby controlling the position of carbon nanotubes. The flow path pattern is made of a filmy material. The respective flow paths are formed in parallel to each other at constant intervals, and an interval M between adjacent facing electrodes and an interval N between adjacent flow paths have a constant relation between them. Liquid pools for the carbon nanotube-dispersed solvent are provided at ends of the flow path pattern to allow the liquid pools to communicate with the respective flow paths.

18 Claims, 6 Drawing Sheets

NANOTUBE POSITION CONTROLLING METHOD, NANOTUBE POSITION CONTROLLING FLOW PATH PATTERN AND ELECTRONIC ELEMENT USING NANOTUBE

This application is a U.S. National Phase Application under 35 USC 371 of International Application PCT/JP2005/008680 filed May 12, 2005.

TECHNICAL FIELD

The present invention relates to a nanotube position controlling method, a nanotube position controlling flow path pattern and an electronic element using nanotube.

BACKGROUND TECHNOLOGY

A nanotube has a one-dimensional structure with nanometer-level width, and draws attention as a material for a nano-device due to its micro-structure. When the material that constructs a circuit is micro-structured, a scale of integration is drastically incremented, so that a capacity of a semiconductor integrated circuit will be drastically improved.

However, it has been extremely difficult to control the position and orientation of the nanotube, because of its micro-structure.

The prior art documents are, for example, as follows:

Patent document 1: Japanese patent publication No. 2003-332266A

Non-patent document 1: Conference proceedings of The 64rd Annual Meeting of The Japan Society of Applied Physics, 2003 Autumn, at The Fukuoka University, 3/aE-1

The patent document 1 discloses a technique wherein carbon nanotube-dispersed ethanol liquid is dropped between electrodes, and a high-frequency voltage is applied between the electrodes, so that the nanotube is connected between the electrodes. The non-patent document 1 discloses a technique wherein carbon nanotube dispersed in an organic solvent is dropped onto an insulator substrate so that the nanotube is connected between the electrodes.

DISCLOSURE OF THE INVENTION

Problems to be Solved by the Invention

However, both of these prior arts include application of carbon nanotube onto a substrate by dropping of solvent, which has a disadvantage that one specific electrode may be crowded with an excessive amount of the carbon nanotube, which means that suspension between the electrodes should be achieved uncertainly, only as an accident. Even if the carbon nanotube is once suspended accidentally, there is a great probability that another nanotube remaining above the electrodes falls down to be suspended between the same pair of the electrodes. In addition, the technique of the non-patent document is not suitable to mass-production.

It is therefore an object of the present invention to eliminate the above-described disadvantages and makes it possible that nanotube is suspended between the electrodes stably, which is suitable to mass-production.

Means for Solving the Problems

To achieve the above object, a nanotube position controlling method according to the present invention is characterized in that a flow path pattern provided with a plurality of flow paths along the facing direction of electrodes is placed on a substrate provided with a plurality of the facing electrodes, a nanotube dispersed solvent is guided to flow in one direction through a tunnel-like path formed by the electrode and the flow path, the nanotubes each comprising a single electron are successively suspended between the facing electrodes, and, after the solvent is dried, the flow path pattern is peeled off the substrate.

In addition, it may also be characterized in that the flow path is formed to extend substantially straight, the nanotube is a carbon nanotube, and there is some correlation between the interval between adjacent electrodes and the interval between the adjacent flow paths. This is characterized in that the interval between the adjacent electrodes is determined smaller than the interval between the adjacent flow paths, or the interval between the adjacent electrodes is determined greater than the interval between the adjacent flow paths, or the interval between the adjacent electrodes equal to the interval between the adjacent flow paths. Further, it may also be characterized in that an inlet to the flow path is determined greater than flow path, the electrodes are mounted to a circular buffer, the adjacent electrodes are connected to each other by a leakage preventing path, and a thin wire for fuse is connected between the electrodes and integrated electrodes.

The present invention also provides a nanotube position controlling flow path pattern comprising a filmy material placed on a substrate provided with a plurality of facing electrodes, and is provided with a plurality of flow paths along the facing direction of the electrodes, said flow paths being formed in parallel to each other at constant intervals, the interval between the adjacent flow paths has some correlation to the interval between the adjacent electrodes so as to form tunnel-like path between the electrodes and the flow paths, and liquid pools are provided at ends of the filmy material for accommodating a nanotube dispersed solvent, said liquid pools being in communication with the respective flow paths for allowing the nanotubes, each comprising a single electron, to introduce thereinto.

The above-described nanotube position controlling flow path pattern may also be characterized in that the flow path is formed to extend substantially straight, the interval between the adjacent flow paths is determined greater than the interval between the adjacent electrodes, the interval between the adjacent flow paths is determined smaller than the interval between the adjacent electrodes, the interval between the adjacent flow paths equal to the interval between the adjacent electrodes, an inlet to the flow path is determined greater than flow path, and the filmy material comprises silicon rubber.

The present invention also provides an electronic element using nanotubes comprising a substrate, a plurality of facing electrodes mounted on the substrate, and single-electron nanotubes suspended between the electrodes without intersection with each other, said single-electron nanotubes being dispersed in a solvent and guided into flow paths of the flow path pattern removably placed on the electrodes so as to flow from one electrode to the other.

Advantages of the Invention

In accordance with the invention, the nanotube-dispersed solvent flows and moves in the flow path of the flow path pattern, so that movement of the nanotube is limited to a specific range defined by the flow path. Accordingly, even if the nanotube-enters the flow path in a winding condition, it is corrected by the flow path. The flow path is formed to extend straight. As a result, the nanotube is controlled to have proper position and orientation and, therefore, can be suspended between the electrodes without intersection.

The nanotube-dispersed solvent flows in one direction, which substantially prevents re-suspension due to fall-down of another nanotube, resulting in stable suspension.

The above-described nanotube position control allows many nanotubes to be controlled at the same time for the substrate, because there are many flow paths. It may be possible to neglect the yield per unit electrode. Accordingly, this invention provides improved productivity, and reduced production cost, and is suitable to mass-production.

DESCRIPTION OF LEGENDS

1 Substrate
2 Buffer
3a, 3b Electrodes
4a, 4b Integrated electrodes
5 Flow path pattern
5a Flow path
5b Liquid pool
5c Liquid pool
5d Inlet
6 Leakage preventing path
7 Nanotube
9 Thin wire for fuse
10 Wire
11 Silver paste

BEST PREFERRED EMBODIMENTS OF THE INVENTION

Next, the present invention will be described in more detail in reference to the drawings showing the embodiments. For convenience, a part or element having the same function is shown by the same reference numeral, and its description will be omitted.

Figure 1:
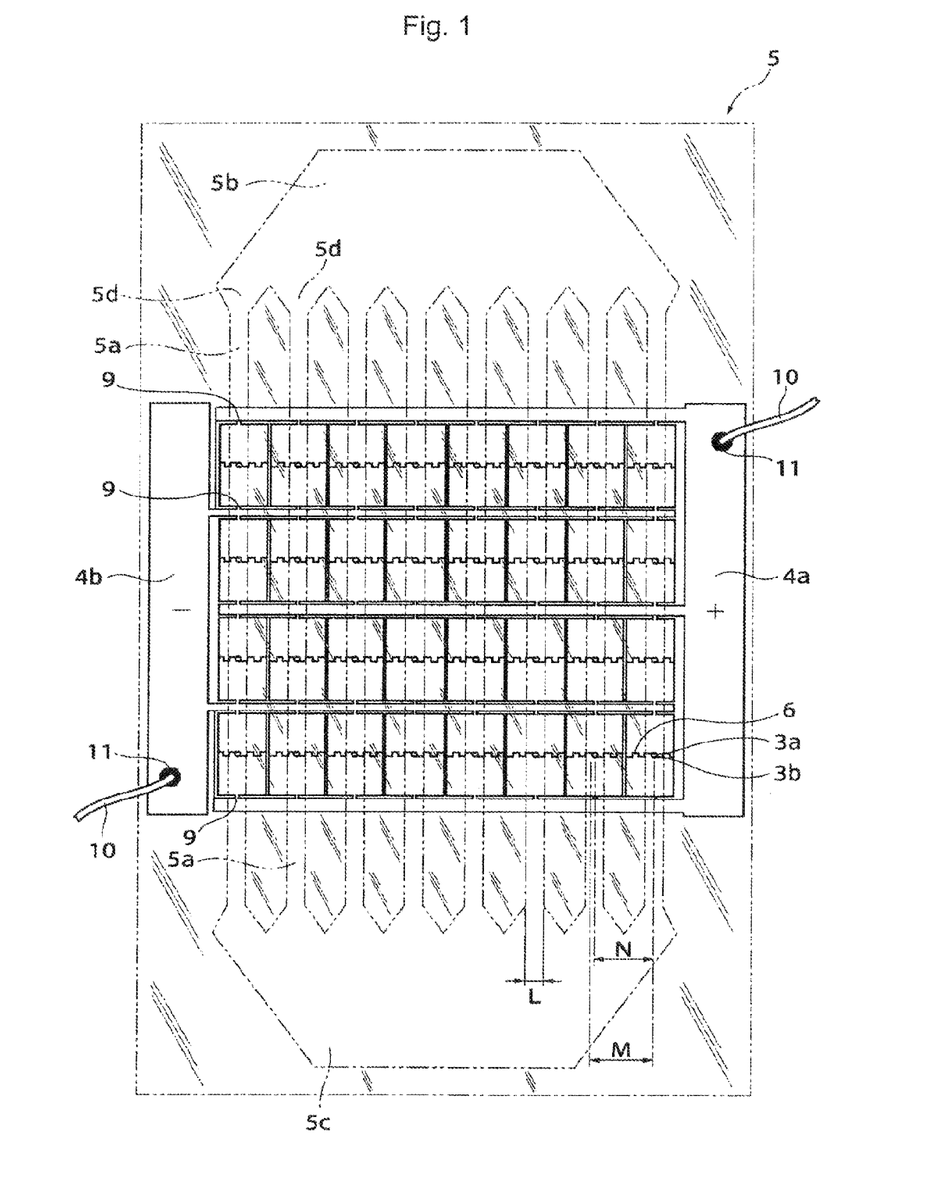
FIG. 1 is a plan view diagrammatically showing an embodiment of the nanotube position controlling method according to the present invention.
Figure 2:
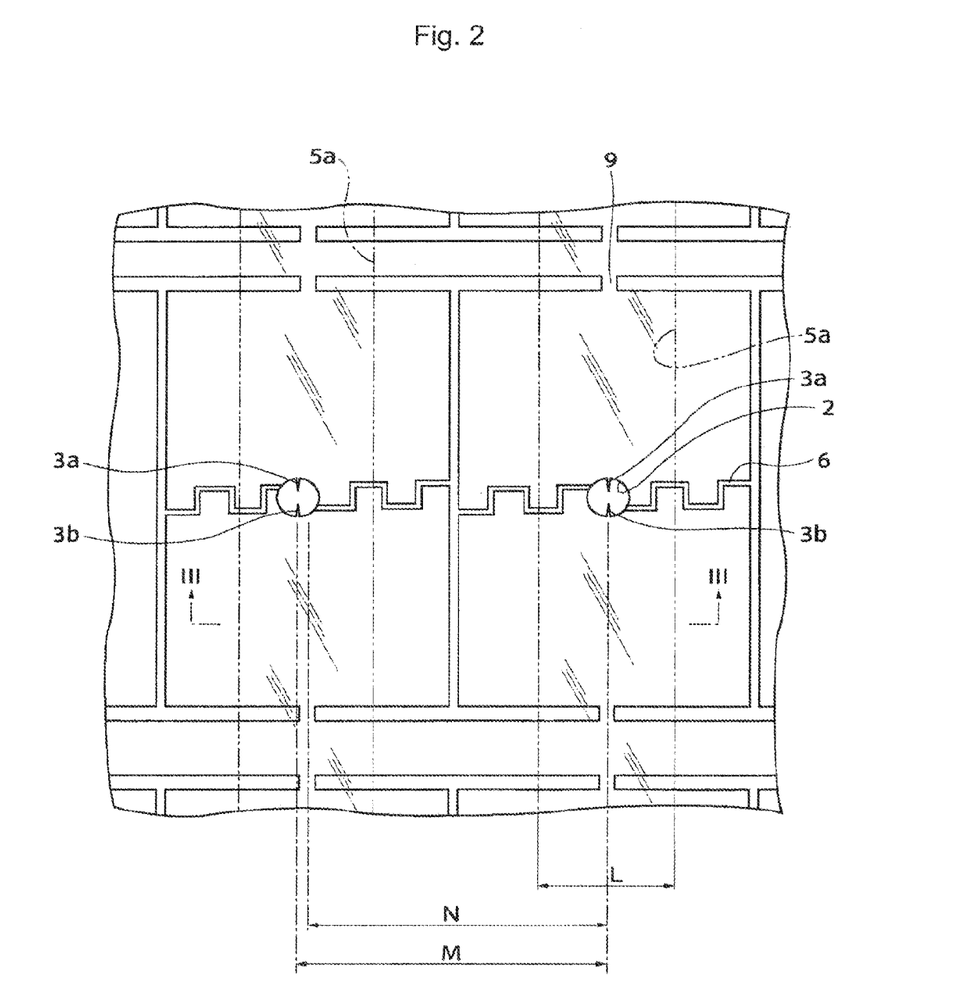
FIG. 2 is an enlarged view showing a part of FIG. 1.
Figure 3:
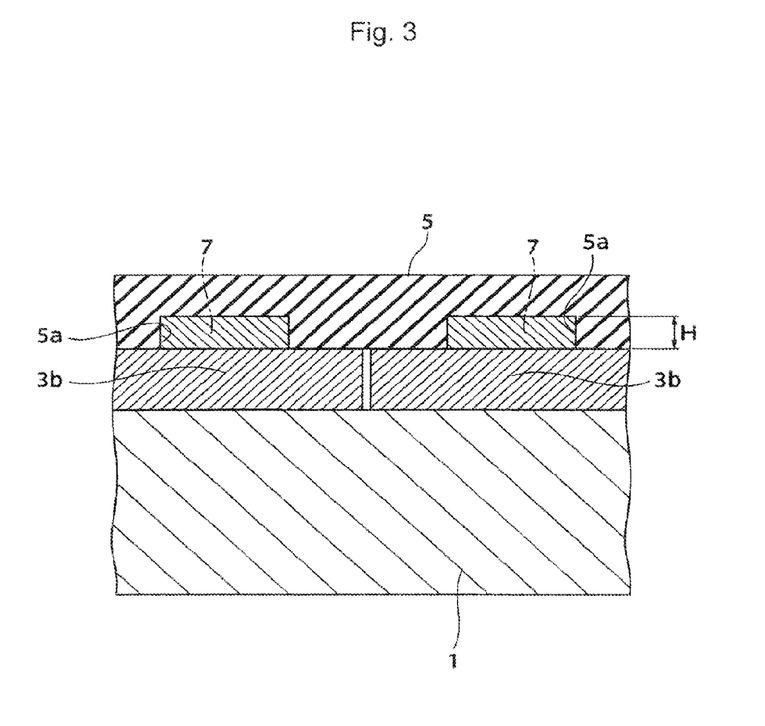
FIG. 3 is a sectional view taken along III-III in FIG. 2.

FIGS. 1-3 show a nanotube position controlling method according to the present invention and also show a method of manufacturing an electronic element using the nanotube according to the present invention. The method of manufacturing an electronic element using the nanotube according to the present invention is carried out by the following steps (1) through (3).

(1) Electrode preparation

<1> Substrate Cleaning

A silicon substrate or wafer is immersed in a solution of acetone and subjected to ultrasonic cleaning for 5 minutes. Then, the substrate is picked up and the solution deposited on the substrate 1 is blown away by nitrogen gas. The substrate 1 is then immersed in a solution of ethanol and again subjected to ultrasonic cleaning for 5 minutes. Then, the substrate is picked up and the solution deposited on the substrate 1 is blown away by nitrogen gas.

<2> Metallic Thin Film Deposition

The silicon substrate processed by the step <1> is placed in a vacuum deposition device and subjected to vacuum drawing. The process conditions include a room temperature, vacuum of $10xe^{-6}$ torr, source of deposition comprising aluminum (Al) or gold (Au), film thickness of 3000 Å. The source of deposition is heated by a heater and deposited on the substrate 1 as a metallic thin film. When the film has been grown to have predetermined thickness, the deposition process is finished, so that a chamber is returned to an atmosphere and the substrate 1 is taken out.

<3> Register Coating

The substrate 1 processed by the step <2> is mounted to a substrate holder of a spinner, and the substrate holder is pumped up. Then, an appropriate quantity of a register (not shown) made from suitable photosensitive material is coated to the substrate 1, which is then subjected to slow-speed rotation (600 rpm) for about 5 seconds, followed by high-speed rotation (5,000 rpm) for about 90 seconds. After that, the substrate 1 is taken out of the substrate holder.

<4> Register Hardening

The substrate 1 processed by the step <3>, to which the register has been applied, is heated in an oven to 180° C. for 20 minutes to harden the register.

<5> Patterning

The substrate 1 processed by the step <4> is placed on a stage of an electronic beam lithography (not shown) and subjected to vacuum drawing. The lithography is focused on the register surface to produce a predetermined pattern. After the patterning, the chamber is returned to an atmosphere and the substrate 1 is taken out.

<6> Developing and Rinsing

The substrate 1 processed by the step <5>, having a predetermined pattern, is immersed in a developer for about 3.5 minutes for developing. The substrate 1 is drawn out from the developer, and the developer remaining on the substrate 1 is blown away by a blower. Then, after immersing the substrate 1 in a rinse for about 15 seconds, the substrate 1 is drawn out and the rinse remaining thereon is blown away by a blower.

<7> Wet Etching

The substrate 1 processed by the step <6> is immersed in a liquid of acidity for wet etching. The liquid of acidity may consist of 1 ml of phosphoric acid and 98 ml of pure water, for example. The immersion is carried out at a temperature of about 30° C., for about 60 seconds. After that, the substrate is immersed in pure water to remove the liquid of acidity from the substrate 1.

<8> Register Removal

After the step <7> is completed, the substrate 1 is immersed in a register remover (that is 3-penthanon, for example) for about 10 minutes so that the register is peeled off. After that, the remover is blown away by a blower and the substrate is immersed in ethanol. Then, it is picked up from ethanol, followed by natural drying. Thus, plural electrodes 3a, 3b of aluminum are formed on the substrate 1.

(2) Flow Path Pattern Preparation

<9> Flow Path Patterning

A flow path pattern substrate is thrown into an electronic beam lithography (not shown) so that a pre-designed flow path pattern is formed thereon.

Figure 4:
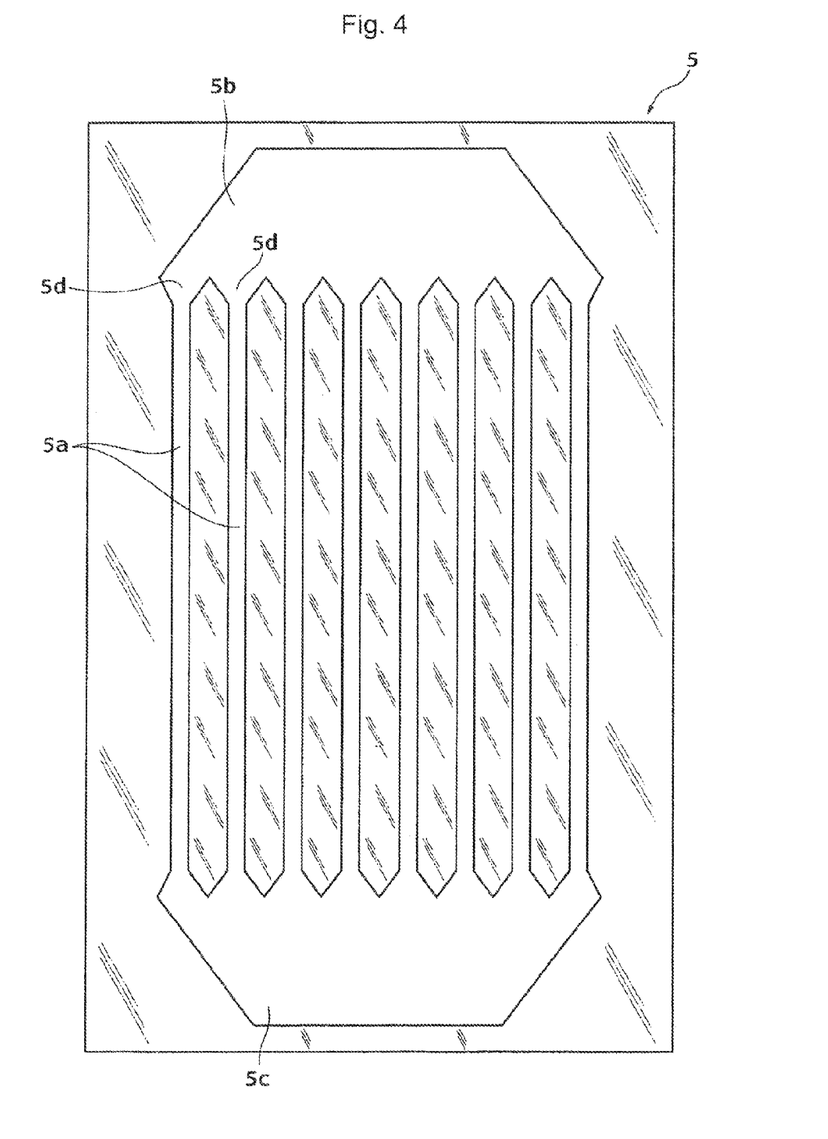
FIG. 4 is a plan view showing an embodiment of the nanotube position controlling flow path pattern according to the present invention.
Figure 5A:
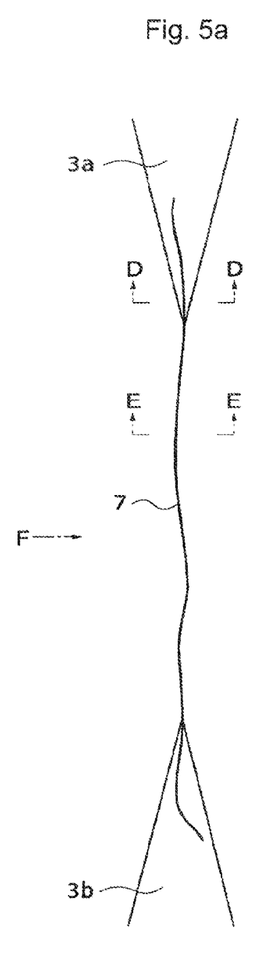
FIG. 5A, B and C show an embodiment of the electronic element using the the nanotube according to the present invention and are views diagrammatically showing electron microscopic pictures of the nanotube suspended between the electrodes, D is a D-D sectional view in A, E is an E-E sectional view in A, and F is a view on a reduced scale showing A in F direction.
Figure 5B:
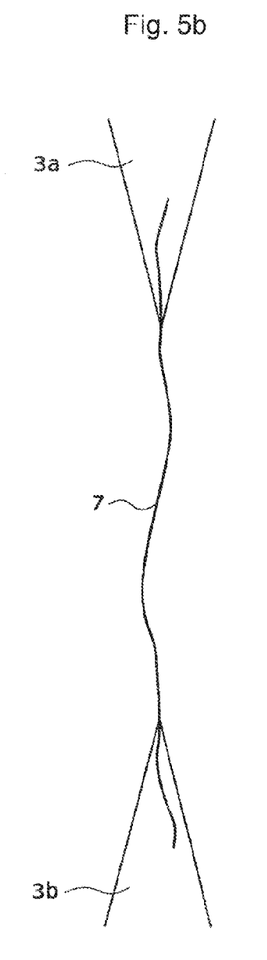
Figure 5C:
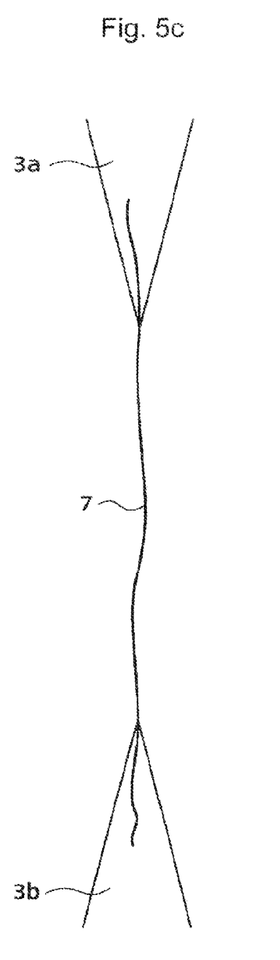
Figure 5D:
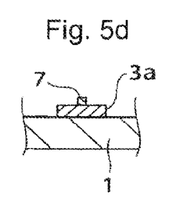
Figure 5E:
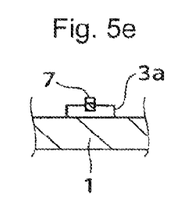
Figure 5F:
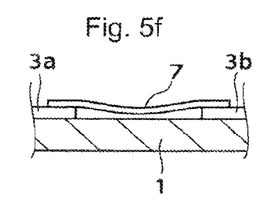

<10> Developing, Rinsing, Wet Etching, Silicon Rubber Application, Hardening and Removal After the developing, rinsing and wet-etching steps are carried out in the same manner as in the process (1), a suitable quantity of silicon rubber (PDMS) is coated on the flow path pattern substrate. The silicon rubber includes a hardening agent. The flow path pattern substrate is heated with a hot plate at 110° C. for about 6 minutes to thereby harden the silicon rubber. Then, the silicon rubber is removed from the flow path pattern substrate to thereby form a flow path pattern 5. Usually, the flow path pattern 5 has flow paths 5a having height H of less than 1 micrometer.

(3) Nanotube Suspension

<11> Wiring

The electrodes of the substrate 1 produced by the process (1) are subjected to wiring. Wires 10 are not connected to plural electrodes 3a, 3b one by one, but to integrated electrodes 4a, 4b via silver paste 11, which are, in turn, connected to a power source.

<12> Flow Path Pattern Mounting

The flow path pattern 5 produced by the process (2) is mounted on the plural electrodes 3a, 3b of the substrate 1 produced by the process (1), thereby forming tunnel-like flow path (FIG. 3) between the electrodes 3a, 3b and the respective flow paths 5a in the flow path pattern 5. Once the flow path pattern 5 is placed, it will tightly contact with the surfaces of the plural electrodes 3a, 3b, due to its elastic adhering capacity of silicon rubber material.

<13> Solvent Supply

After a voltage is applied to between the electrodes 4a, 4b, a solvent of dichloroethane into which carbon nanotubes are dispersed is applied to a liquid pool 5b. The process conditions are:

Pressure: atmosphere
Temperature: room temperature (23° C.)
Voltage applied: DC voltage of less than 0.01V
Resistance: 200 k$\Omega$ in series
Quantity of solvent: about 0.01 ml <14> Position control The nanotubes 7 in the solvent supplied to the liquid pool 5b behave electrophoresis in the above-described tunnel-like flow path due to electric fields between the electrodes 3a, 3b, so that they are successively suspended between the facing electrodes 3a, 3b, one by one, that is single-electron by single-electron. After the solvent is dried, the flow path pattern 5 is peeled off from the substrate 1. Thus, the position control for the nanotubes 7 has been completed.

FIG. 5 shows the nanotube 7 that has been suspended between the electrodes 3a, 3b in controlled position. More particularly, the electronic element using the nanotube according to the present invention comprises the electrodes 3a, 3b vapor-deposited on the substrate 1 and the carbon nanotube 7 suspended between the electrodes 3a, 3b. Such electronic elements are integrated in approximately 2,000,000 per 1 cm square, for example. One nanotube 7 is suspended between the electrodes 3a, 3b as a single-electron, without crossing or intersection. Regarding no intersection for the nanotube 7, it may not only extend straightly but may also slightly bent or curve as shown in FIG. 5(a)-(c). However, it can not be coiled itself. Also, it excludes that two or more nanotubes are suspended between the same pair of electrodes.

The above-described embodiment provides the following advantages. First, because the flow paths 5a extend straight, the nanotubes 7 dispersed in the solvent may be controlled to have proper position and orientation and, therefore, may be successively suspended between the electrodes 3a, 3b without intersection.

Figure 6:
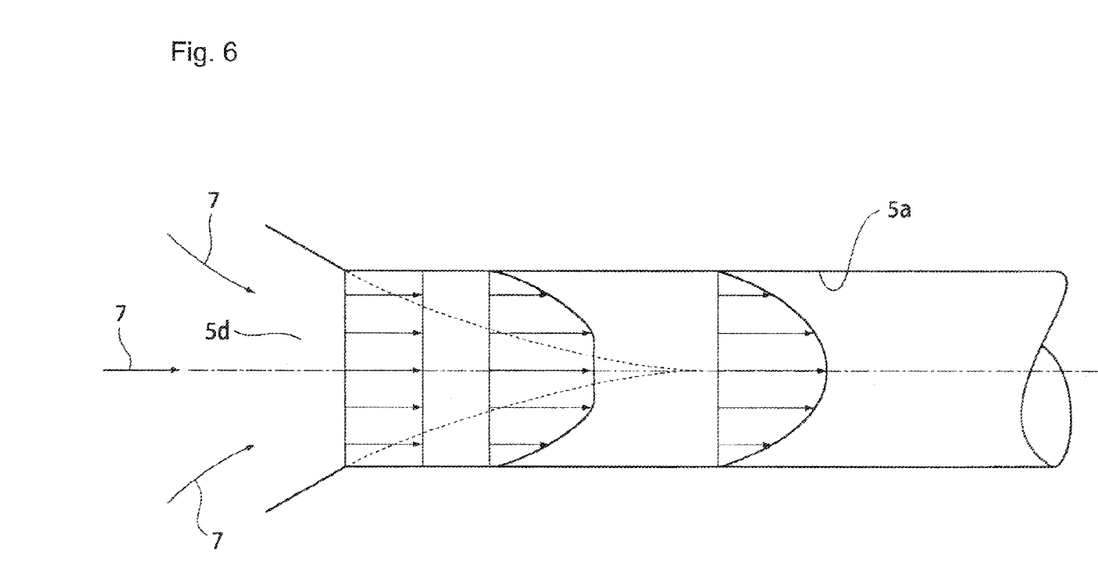
FIG. 6 is a view used for explanation of advantages of the present invention.

This will be described in more detail in reference to FIG. 6. When the solvent flows into the tunnel-like flow path 5a, its flow should be changed by the fact that an inlet 5d is formed wider than the flow path 5a. More particularly, the flow uniformly entering the inlet 5d creates a boundary layer shown by the arrow, which will grow along the flow path 5a. Accordingly, the flow will be obstructed by the boundary layer and tend to go toward the center of the flow path 5a to increase it flow rate. The thickness of the boundary layer is increased as it grows toward the downstream, which will more increase the flow rate at the center area. The inlet 5d is narrowed in the flow direction. Hydrodynamic theory says that such construction makes it easy to convert hydraulic energy to velocity energy, with negligible loss. Thus, the nanotube 7 is drawn into the flow path 5a and accelerates while flowing through the flow path 5a. The position and orientation of the nanotube 7 will be corrected by such flow movement. In addition to the fact that the flow path 5a extends straight, the position and orientation of the nanotube 7 will surely and stably be corrected. Accordingly, the nanotubes 7, each comprising a single electron, will successively be suspended between the electrodes 3a, 3b without intersection.

The nanotube-dispersed solvent flows from the liquid pool 5b toward the facing liquid pool 5c in one specific direction, as a capillary action. This prevents that another nanotube 7 is supplied onto the already-suspended nanotube 7, which is a disadvantage of the prior art wherein a drop of nanotube-dispersed liquid falls down. Therefore, according to the present invention, the nanotube 7 may be suspended between the electrodes in a stable condition.

Since the electrodes 3a, 3b are formed in opposition on a circular buffer 2, the electric fields are formed intensively at the leading end portions of the electrodes 3a, 3b, so that the nanotubes 7 in the solvent will rush to the electrodes 3a, 3b and adhere thereto successively. This will more contribute to the position control of the nanotubes 7.

The flow path pattern 5 is mounted on plural electrodes 3a, 3b, and plural flow paths 5a formed in the flow path pattern 5 will achieve successive suspension of the nanotubes 7 each comprising a single electron. Accordingly, nano-level position control is achievable, even if the flow path pattern 5 has no definite position.

This will be described in reference to a numerical model. For example, when the interval M between a pair of facing electrodes 3a, 3b and anther, adjacent pair of facing electrodes 3a, 3b is 20 micrometers, the interval N between the adjacent flow paths 5a, 5a is 19.5 micrometers and the width L of the flow path 5a is 4 micrometers, the flow path 5a will be aligned with the facing electrodes 3a, 3b at a frequency of $1/40$, which is calculated by the equation: $20/(20-19.5)=40$. This will also be applicable in the case of M<N. The values of M, N may become closer and closer to each other by production technology development. When these values become smaller, the position control for the nanotube 7 will have a greater yield. In a theoretical case of M=N, the yield will be 100%.

The electrodes are separate from the flow path pattern, which make the electrode design easier.

The solvent flows out of the liquid pool 5b and through the flow path 5a, resulting in no liquid leakage out of the flow path pattern 5. In the prior art liquid-dropping method, the silver paste applied to the electrode could dissolve, but this is not the case for the present invention.

One pair of the facing electrodes 3a, 3b are connected to another adjacent pair of the facing electrodes 3a, 3b, via a leakage preventing path 6, which prevents the nanotube 7 from flowing out of its flow path 5a to the adjacent pair of the facing electrodes 3a, 3b.

The voltage applied is low so that suspension can be made between the electrodes 3a, 3b without causing rupture of characteristic structure of the nanotube.

The production can be made in an atmosphere at a room temperature, requiring no special equipment, which also reduces the production cost and is good for mass-production.

Where a thin wire for fuse 9 is connected between the facing electrodes 3a, 3b and the integrated electrodes 4a, 4b, the thin wire for fuse 9 will be down at first when an excessive electricity flows, which means that the suspension can be made under a low voltage, with no need to flow too much electricity. Therefore, the characteristic construction of the nanotube should be maintained. When the thin wire for fuse 9 is broken down, high temperature will arise but is soon lowered by the solvent, which prevents rupture of the characteristic construction of the nanotube.

The present invention is not limited to the above-described embodiments. For example, the interval M between the adjacent pairs of the facing electrodes, the interval N between the adjacent flow paths, and the flow path width L may be determined suitably. The shape of the buffer 2 is also optional. The leakage preventing path 6 and/or the thin wire for fuse 9 may be omitted. Their sizes and shapes may be determined suitably.

Material of wafer 1, electrodes 3a, 3b and flow path pattern 5, and the solvent to which the nanotube is dispersed are all optional. How to supply the nanotube is also optional.

Regarding the nanotube, a nanotube equivalent to a carbon nanotube (CNT), including a boron-carbon-nitrogen nanotube (BCN nanotube), a boron-nitrogen nanotube (BN nanotube), and various chemically-modified nanotubes may be used in the present invention.

The flow path pattern 5 may not be transparent.

Industrial Applicability

When the present invention is applied, for example, to a semiconductor element, its circuit will have drastically incremented scale of integration, thereby drastically improving a capacity of a semiconductor integrated circuit.

The invention claimed is:

1. A nanotube position controlling method comprising:
    placing on a substrate having a plurality of facing electrodes, a flow path pattern which has a plurality of flow paths along a facing direction of the plurality of the facing electrodes, wherein leading end portions of the plurality of facing electrodes are tapered off to a point, wherein the substrate also has a plurality of integrated electrodes, wherein a plurality of thin wires fuses are connected between the plurality of the facing electrodes and the integrated electrodes, wherein the plurality of thin wires fuses are provided so as to have a one-to-one correspondence relation with the plurality of the facing electrodes, and wherein a width of the plurality of thin wires fuses and a width of the plurality of integrated electrodes are different,
    applying a voltage between the plurality of the facing electrodes,
    guiding a flow of a nanotube dispersed solvent in one direction through a tunnel-like path formed by at least one of the plurality of the facing electrodes and one of the plurality of flow paths, to successively and respectively suspend a plurality of nanotubes between a plurality of the facing electrodes, without intersection, and after the solvent is dried, peeling off the flow path pattern from the substrate.

2. The nanotube position controlling method according to claim 1, wherein each of the plurality of flow paths is formed to extend substantially straight.

3. The nanotube position controlling method according to claim 1, wherein each of the plurality of nanotubes is a carbon nanotube.

4. The nanotube position controlling method according to claim 1, wherein an interval between adjacent ones of the plurality of the facing electrodes and an interval between adjacent ones of the plurality of flow paths is correlated.

5. The nanotube position controlling method according to claim 4, wherein the interval between the adjacent facing electrodes is smaller than the interval between the adjacent flow paths.

6. The nanotube position controlling method according to claim 4, wherein the interval between the adjacent facing electrodes is greater than the interval between the adjacent flow paths.

7. The nanotube position controlling method according to claim 4, wherein the interval between the adjacent facing electrodes is equal to the interval between the adjacent flow paths.

8. The nanotube position controlling method according to claim 1, wherein an inlet to said one of the plurality of flow paths is formed wider than said one of the plurality of flow paths.

9. The nanotube position controlling method according to claim 1, wherein the plurality of the facing electrodes are mounted on circular buffers.

10. The nanotube position controlling method according to claim 1, wherein adjacent ones of the plurality of the facing electrodes are connected to each other by a leakage preventing path.

11. A nanotube position controlling flow path pattern which is removably placeable on a substrate having a plurality of facing electrodes, and means for applying a voltage between the plurality of the facing electrodes, wherein leading end portions of the plurality of facing electrodes are tapered off to a point, wherein the substrate also has a plurality of integrated electrodes, wherein a plurality of thin wires fuses are connected between the plurality of the facing electrodes and the integrated electrodes, wherein the plurality of thin wires fuses are provided so as to have a one-to-one correspondence relation with the plurality of the facing electrodes, and wherein a width of the plurality of thin wires fuses and a width of the plurality of integrated electrodes are different, the flow path pattern having:
    a plurality of flow paths along a facing direction of the plurality of the facing electrodes,
        wherein the plurality of flow paths are formed in parallel to each other at a constant interval, and
        wherein the interval between adjacent ones of the plurality of flow paths and an interval between adjacent ones of the plurality of the facing electrodes is correlated so as to form a tunnel-like path between at least one of the plurality of the facing electrodes and one of the plurality of flow paths, and liquid pools which are provided at ends of the flow path pattern for accommodating a nanotube dispersed solvent, wherein the liquid pools are in communication with the plurality of flow paths for allowing introduction of a plurality of nanotubes in the plurality of flow paths, and wherein the flow path pattern is made of a filmy material.

12. The nanotube position controlling flow path pattern according to claim 11, wherein each of the plurality of flow paths is formed to extend substantially straight.

13. The nanotube position controlling flow path pattern according to claim 11, wherein the interval between the adjacent flow paths is greater than the interval between the adjacent facing electrodes.

14. The nanotube position controlling flow path pattern according to claim 11, wherein the interval between the adjacent flow paths is smaller than the interval between the adjacent facing electrodes.

15. The nanotube position controlling flow path pattern according to claim 11, wherein the interval between the adjacent flow paths is equal to the interval between the adjacent facing electrodes.

16. The nanotube position controlling flow path pattern according to claim 11, further having an inlet to each of the plurality of flow paths, wherein the inlet is formed wider than a corresponding flow path.

17. The nanotube position controlling flow path pattern according to claim 11, wherein the filmy material comprises silicon rubber.

18. An electronic element comprising:

a substrate, a plurality of facing electrodes mounted on the substrate, wherein leading end portions of the plurality of facing electrodes are tapered off to a point, a plurality of integrated electrodes mounted on the substrate, a plurality of thin wires fuses which are connected between the plurality of the facing electrodes and the integrated electrodes, wherein the plurality of thin wires fuses are provided so as to have a one-to-one correspondence relation with the plurality of the facing electrodes, and wherein a width of the plurality of thin wires fuses and a width of the plurality of integrated electrodes are different, means for applying a voltage between the plurality of the facing electrodes, and a plurality of nanotubes respectively suspended between the plurality of the facing electrodes without intersection with each other, wherein the plurality of the nanotubes are dispersed in a solvent and are guided into a plurality of flow paths of a flow path pattern which is removably placed on the plurality of the facing electrodes so as to flow nanotubes from a first one of the plurality of the facing electrodes to a second one of the plurality of the facing electrodes.

* * * * *

UNITED STATES PATENT AND TRADEMARK OFFICE
CERTIFICATE OF CORRECTION

| | | |
|---|---|---|
| PATENT NO. | : 8,262,898 B2 | |
| APPLICATION NO. | : 11/597074 | |
| DATED | : September 11, 2012 | |
| INVENTOR(S) | : Masanori Ashitomi | |

It is certified that error appears in the above-identified patent and that said Letters Patent is hereby corrected as shown below:

In the Claims:

Column 7, Claim 1, Line 8;

change "wires" to --wire--.

Column 7, Claim 1, Line 11;

change "wires" to --wire--.

Column 7, Claim 1, Line 14;

change "wires" to --wire--.

Column 8, Claim 11, Line 7;

change "wires" to --wire--.

Column 8, Claim 11, Line 10;

change "wires" to --wire--.

Column 8, Claim 11, Line 12;

change "wires" to --wire--.

Column 10, Claim 18, Line 8;

change "wires" to --wire--.

Signed and Sealed this
Twenty-eighth Day of May, 2013

Teresa Stanek Rea
*Acting Director of the United States Patent and Trademark Office*

CERTIFICATE OF CORRECTION (continued)
U.S. Pat. No. 8,262,898 B2

In the Claims:

Column 10, Claim 18, Line 13;

change "wires" to --wire--.

UNITED STATES PATENT AND TRADEMARK OFFICE
CERTIFICATE OF CORRECTION

PATENT NO. : 8,262,898 B2
APPLICATION NO. : 11/597074
DATED : September 11, 2012
INVENTOR(S) : Masanori Ashitomi Page 1 of 1

It is certified that error appears in the above-identified patent and that said Letters Patent is hereby corrected as shown below:

In the Claims:

Column 10, Claim 18, Line 10;

change "wires" to --wire--.

Signed and Sealed this
Thirty-first Day of December, 2013

Margaret A. Focarino
*Commissioner for Patents of the United States Patent and Trademark Office*